(12) United States Patent
Barrett et al.

(10) Patent No.: US 7,927,766 B2
(45) Date of Patent: Apr. 19, 2011

(54) PRE-ALIGNMENT MARKING AND INSPECTION TO IMPROVE MASK SUBSTRATE DEFECT TOLERANCE

(75) Inventors: Monica J. Barrett, Colchester, VT (US); Kevin W. Collins, Essex Junction, VT (US); Daniel B. Sullivan, Edina, MN (US)

(73) Assignee: International Business Machines Corporation, Armonk, NY (US)

( * ) Notice: Subject to any disclaimer, the term of this patent is extended or adjusted under 35 U.S.C. 154(b) by 504 days.

(21) Appl. No.: 12/041,076

(22) Filed: Mar. 3, 2008

(65) Prior Publication Data

US 2009/0220866 A1 Sep. 3, 2009

(51) Int. Cl.
*G03F 1/00* (2006.01)
*G03F 1/14* (2006.01)

(52) U.S. Cl. ........................................................ 430/5
(58) Field of Classification Search ........................ 430/5
See application file for complete search history.

(56) References Cited

U.S. PATENT DOCUMENTS

| 3,874,916 A * | 4/1975 | Livesay et al. ................... 430/5 |
| 6,765,673 B1 * | 7/2004 | Higashikawa ................... 430/5 |
| 2007/0106416 A1 * | 5/2007 | Griffiths et al. .......... 219/121.68 |

OTHER PUBLICATIONS

Hector, S. et al., "Shifting pattern data to avoid mask blank defects", Nov. 20, 2001, IP.com Prior Art Database, www.ip.com.

* cited by examiner

*Primary Examiner* — Stephen Rosasco
*Assistant Examiner* — John Ruggles
(74) *Attorney, Agent, or Firm* — Richard Kotulak; Roberts Mlotkowski Safran & Cole, P.C.

(57) ABSTRACT

A method includes determining defect types and defect locations on a mask blank and storing the defect types and the defect locations. The method further includes generating at least one alignment mark on the mask blank and selecting a mask pattern for the mask blank based on the defect types and the defect locations. Additionally, the method includes determining a positioning of the mask pattern on the mask blank, aligning a mask pattern generator with the mask blank in accordance with the positioning using the at least one alignment mark and forming the mask pattern on the mask blank using the mask pattern generator.

9 Claims, 7 Drawing Sheets

PRE-ALIGNMENT MARKING AND INSPECTION TO IMPROVE MASK SUBSTRATE DEFECT TOLERANCE

FIELD OF THE INVENTION

The present invention relates to a method and system for pre-alignment marking and inspection, and more particularly, to a method and system for pre-alignment marking and inspection to improve mask substrate defect tolerance.

BACKGROUND OF THE INVENTION

Photolithography (also optical lithography) is a process used in microfabrication to selectively remove parts of a thin film (or the bulk of a substrate). Photolithography uses light to transfer a geometric pattern from a photomask to a light-sensitive chemical (photoresist, or simply "resist") on the substrate. Elements of a circuit to be created on the IC are reproduced in a pattern of transparent and opaque areas on the surface of the photomask (or reticle), e.g., a quartz plate. A stepper passes light through the photomask, forming an image of the photomask pattern. The image may be focused and reduced by a lens, and projected onto the surface of a silicon wafer that is coated with the photoresist.

After exposure in the stepper, the coating on the wafer is developed like photographic film, causing the photoresist to dissolve in certain areas according to the amount of light the areas received during exposure. These areas of photoresist (and no photoresist) reproduce the pattern on the photomask. The developed wafer is then exposed to acids or other chemicals. The acids etch away the silicon in the parts of the wafer that are no longer protected by the photoresist coating. The other chemicals are used to change the electrical characteristics of the silicon in the bare areas. The wafer is then cleaned, recoated with photoresist, then passed through the stepper again, e.g., using another photomask, in a process that creates the circuit on the, e.g., silicon substrate layer by layer. The entire process is called photolithography. In a complex integrated circuit (e.g., a modern CMOS device), a wafer will go through the photolithographic cycle on the order of 50 times.

The photomask is an opaque plate with topography or transparencies that allow light to shine through in a defined pattern. Lithographic photomasks may be, e.g., transparent fused silica or quartz blanks covered with a pattern defined with, e.g., a chrome metal absorbing film. In order to fabricate an integrated circuit, a set of photomasks, each defining a pattern layer in the integrated circuit fabrication, is fed into a photolithography stepper or scanner and individually selected for exposure, as described above. Thus, prior to the fabrication of the integrated circuit device using the photolithographic process, the photomasks are manufactured.

In photomask manufacturing, e.g., quartz blanks are coated with an absorbing material and an imaging film (i.e., a photoresist) to form the photomask pattern. The image for the photomask may originate from a computerized data file. This data file is converted to a series of polygons and written onto, e.g., a square fused quartz substrate covered with a layer of chrome using a photolithographic process. A beam of electrons may be used to expose the photomask pattern defined in the data file and travels over the surface of the photomask blank in either a vector or raster scan manner. Where the photoresist on the photomask exposes a portion on the layer of chrome so that this portion of the chrome can be etched away, leaving a clear path in this portion of the photomask for the light to travel through the photomask in the stepper/scanner systems.

However, a relatively small number of defects on the photomask blank might manifest themselves as defects during photomask patterning, which can affect final photomask quality and result in yield loss (e.g., wafer and/or photomask yield loss) and additional defect repair work. For example, performing photolithography with a photomask that includes defects may cause defects to be formed in the integrated circuit device. Thus, defects in a photomask have a direct impact on photomask manufacturing costs and turn-around times.

The preferred solution to yield loss from photomask blank defects is to lower printable defect count on the photomask blank with cleaner processing and/or repair. However, obtaining defect free photomask blanks (or lowering photomask blank defect count) is a significant challenge as lithographic feature size and the minimum printable defect size continue to be reduced. Moreover, photomask blank defects in new materials that may be needed for the AEPSM (Attenuated Embedded Phase Shift Mask) have increased. This increase in photomask blank defects has in turn reduced the yield after pattern defect inspection and, consequently, final photomask yield. Moreover, next generation lithography techniques, such as electron projection lithography (EPL) and extreme ultraviolet lithography (EUVL), require photomask blanks made from different materials than binary optical masks or AEPSM. These new photomask blanks may initially have more defects than present photomask blanks for optical projection lithography. Therefore, a method to pattern masks with high yield on mask blanks that have defects is desirable.

To enable the use of mask blanks that are not defect free but have a reasonably small number of defects, the pattern on the photomask can be moved so that the photomask blank defects do not affect the printed pattern. If mask blank defects can be accurately located and evaluated, the patterning process can be modified to accommodate some defects on the blank.

However, there is no ability to reliably align the photomask blank with the pattern generator to ensure a higher calibration alignment by the pattern generator. Accordingly, there exists a need in the art to overcome the deficiencies and limitations described hereinabove.

SUMMARY OF THE INVENTION

In a first aspect of the invention a method comprises determining defect types and defect locations on a mask blank, storing the defect types and the defect locations and generating at least one alignment mark on the mask blank. Additionally, the method comprises selecting a mask pattern for the mask blank based on the defect types and the defect locations and determining a positioning of the mask pattern on the mask blank. Furthermore, the method comprises aligning a mask pattern generator with the mask blank in accordance with the positioning using at least one alignment mark and forming the mask pattern on the mask blank using the mask pattern generator.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention relates to a method and system for pre-alignment marking and inspection, and more particularly, to a method and system for pre-alignment marking and inspection to improve mask substrate defect tolerance.

According to an aspect of the invention, a photomask blank inspection tool may be used to mark alignment features in a non-critical region of the photomask blank to allow a higher calibration alignment by a photomask pattern generator. In some embodiments, prior to photomask pattern generation, alignment marks may be scribed or printed on the photomask blank. That is, a photomask blank inspection tool includes a stylus for drawings, e.g., arrows to indicate a defect. These arrows may be used to later locate those defects using, e.g., a scanning electron microscope (SEM).

According to an aspect of the invention, the stylus of the photomask blank inspection tool may be used to generate the alignment marks. Using these alignment marks and photomask blank inspection data, the photomask pattern may be more accurately positioned on the photomask blank to avoid printing critical features of the photomask pattern in regions impacted by substrate defects. By implementing the invention, extremely accurate overlay results enable the dispositioning techniques to use actual photomask pattern data as opposed to pattern density-based statistics.

According to an aspect of the invention, a photomask blank inspection tool may inspect photomask blanks upon arrival at a photomask patterning facility. More specifically, photomask blanks that have been coated with absorbing and imaging films may be inspected for defects prior to photomask pattern generation. This inspection may be used to determine locations and severities of defects in the photomask blanks. Additionally, in embodiments, photomask blank defect types and defect locations may be determined by, e.g., a supplier or a manufacturer of photomask blanks, and defect type and location information may be supplied with the shipment of photomask blanks.

Additionally, according to an aspect of the invention, the photomask blank inspection tool may be used to mark or create alignment features in a non-critical region of the photomask blank to allow a higher calibration alignment by the pattern generator. For example, a LASERTEC inspection tool may be used to generate alignment marks on the photomask blank or substrate. (LASERTEC is a registered trademark of Lasertec Corporation in the United States.) Then, to enable higher resolution coordinate matching, the photomask pattern generator may align to the Lasertec marks formed in the photomask blank. Moreover, based on the improved overlay capability provided by marking the photomask blanks at inspection, photomask pattern formation on the photomask blank may be based on actual computer aided transcription system (CATS) pattern to enable a "tighter fit" of existing defects into non-sensitive regions of the design.

With the known defect locations from a photomask blank defect inspection tool and the alignment features in the photomask blank created by the photomask blank defect inspection tool, the photomask pattern data can be accurately positioned such that the defects in the photomask blank are in non-critical areas of the photomask pattern or are suitable for easy repair after photomask patterning. For example, the pattern data can be translated, rotated, or magnified slightly to avoid known defects. Moreover, critical areas of the mask pattern can be identified to determine how to change the pattern to more efficiently avoid the effects of mask blank defects. That is, if defects are discovered in the photomask substrate during inspection, this information may be used to determine in real-time what pattern to print on the photomask substrate.

Moreover, pattern information such as do-inspect regions (DIRs), do-not-inspect regions (DNIRs) and pattern density may be used to estimate the likelihood of an incoming photomask substrate defect occurring in an area that critical pattern is likely to be affected. Based on these results, photomask blanks may be matched with photomask pattern designs that will minimize the occurrence of defects in critical areas that will cause scrap or require repair. That is, for example, some of these printing defects may be located in regions that are not critical. If these blank defects become defects in the photomask, as these defects in the photomask are located in regions that are not critical, the photomask defects may be repairable. With this approach, the effective yield of mask blank fabrication will be increased and the cost of mask production will be reduced.

Figure 1:
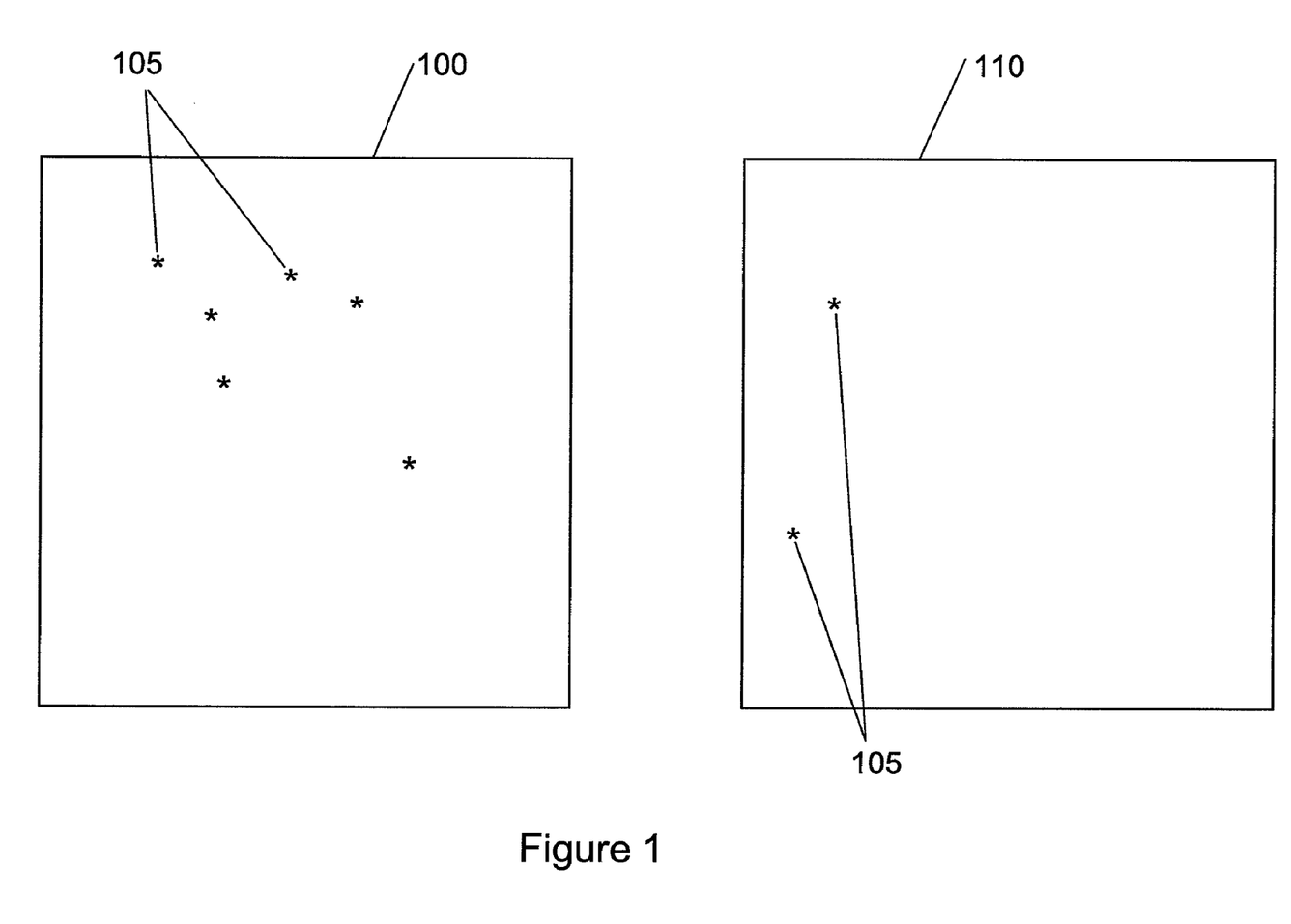
FIG. 1 shows two mask substrates containing defects in accordance with the invention.

FIG. 1 shows two photomask blanks or substrates 100 and 110 having a plurality of defects 105 (represented throughout FIGS. 1-5 as "*"). These defects 105 have been detected, e.g., by a photomask inspection tool and the positions of the defects 105 have been stored, e.g., in a database.

Figure 2:
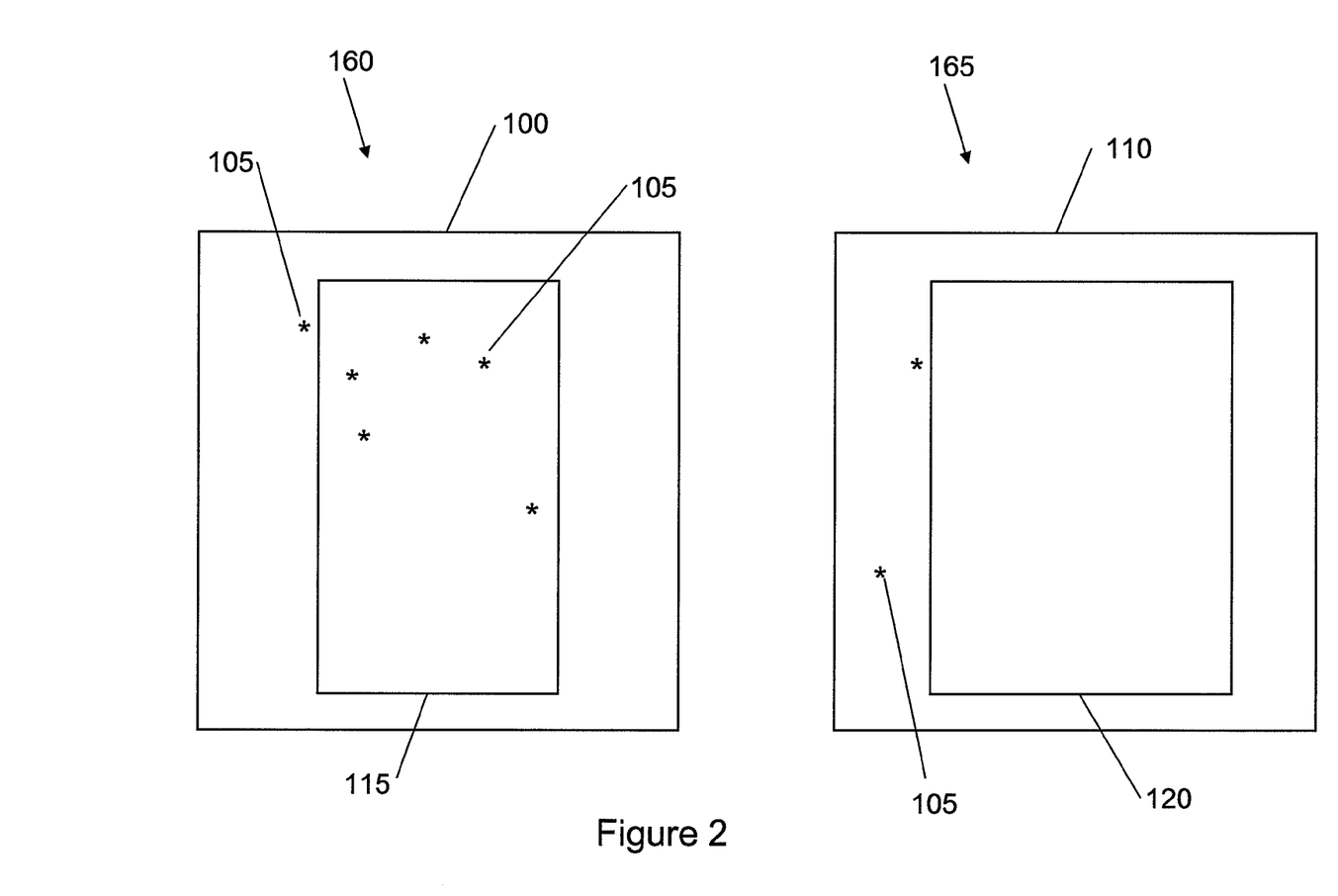
FIG. 2 shows two resulting photomasks having different photomask patterns in accordance with the invention.

FIG. 2 shows the two photomask blanks 100 and 110 with photomask patterns 115 and 120 formed on the photomask blanks 100 and 110, respectively to form resultant photomasks 160 and 165, respectively. As shown in FIG. 2, the photomask pattern 115 formed on photomask blank 100 is positioned such that some of the defects 105 are contained within the photomask pattern 115. Thus, using photomask pattern 115 with the photomask blank 100 may render the resulting photomask 160 defective. Furthermore, using the resulting photomask 160 in a photolithography process may cause defects in an integrated circuit.

In contrast, the photomask pattern 120 formed on photomask blank 110, is positioned such that the region of the photomask pattern 120 does not contain any of the defects 105 therein. Thus, the defects 105 of the resulting photomask 165 will not produce defects in a formed device, e.g., an integrated circuit, when used during a photolithography process.

Figure 3:
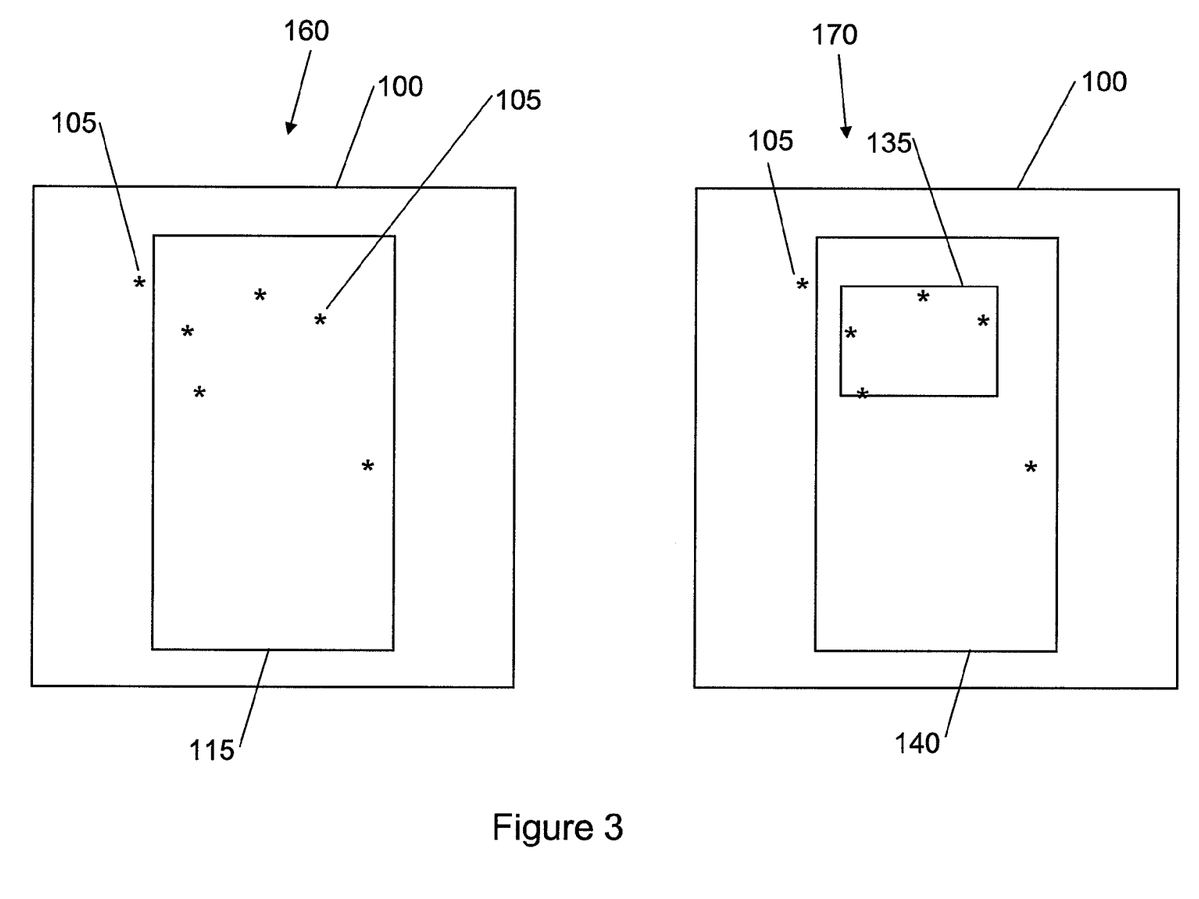
FIG. 3 shows two resulting photomasks having different photomask patterns in accordance with the invention.

FIG. 3 shows the resulting photomask 160 with the photomask pattern 115 formed on the photomask blank 100. As shown, the region of the photomask pattern 115 contains many defects 105. Additionally, FIG. 3 shows a resulting photomask 170 comprising the same photomask blank 100 (having the same defects 105) with a different photomask pattern 140 formed thereon. The photomask pattern 140 includes a "do not inspect region" (DNIR) 135, which may be, e.g., a non-critical portion of the photomask pattern 140. As the DNIR 135 is a non-critical portion of the photomask pattern 140, the defects 105 within this DNIR 135 will not affect the resulting photomask 170. Thus, as shown in FIG. 3, by choosing and positioning a suitable photomask pattern 140, e.g., having a DNIR 135, for a particular photomask blank 100, the number of defects 105 that are present outside of the DNIR 135 may be minimized or eliminated. That is, using photomask pattern 115 on the photomask blank 100 results in five defects being contained in the photomask pattern region. In contrast, using photomask pattern 140 (having DNIR 135) on the photomask blank 100 minimizes the number of defects contained in the photomask pattern region that may cause problems during a photolithography process to one.

Figure 4:
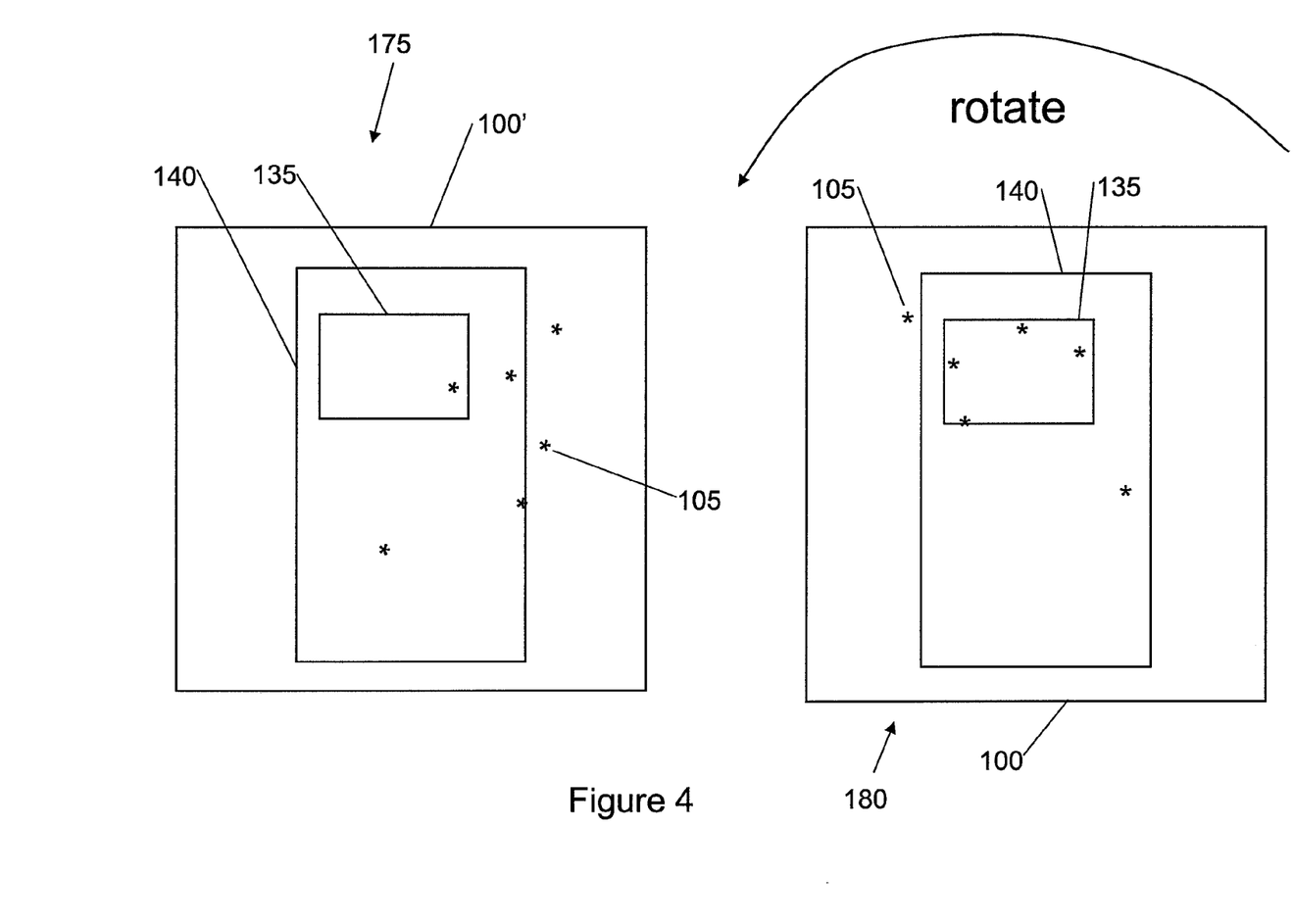
FIG. 4 shows two resulting photomasks having a photomask pattern showing a rotation of the photomask pattern in accordance with the invention.

FIG. 4 shows how rotating a photomask blank may allow for better positioning of a photomask pattern on the photomask blank, wherein the number of defects contained in the photomask pattern region that may cause problems during a photolithography process is minimized. Thus, as shown in FIG. 4, resulting photomask 175 is formed with photomask pattern 140 on photomask substrate 100'. As shown in FIG. 4, the photomask 175 contains three defects 105 of concern in regions of the photomask pattern 140. However, by forming the same photomask pattern 140 on a rotated photomask blank 100, the number of defects 105 of concern (i.e., not within, e.g., a non-critical region of the photomask pattern 140) in the resulting photomask 180 can be minimized.

Figure 5:
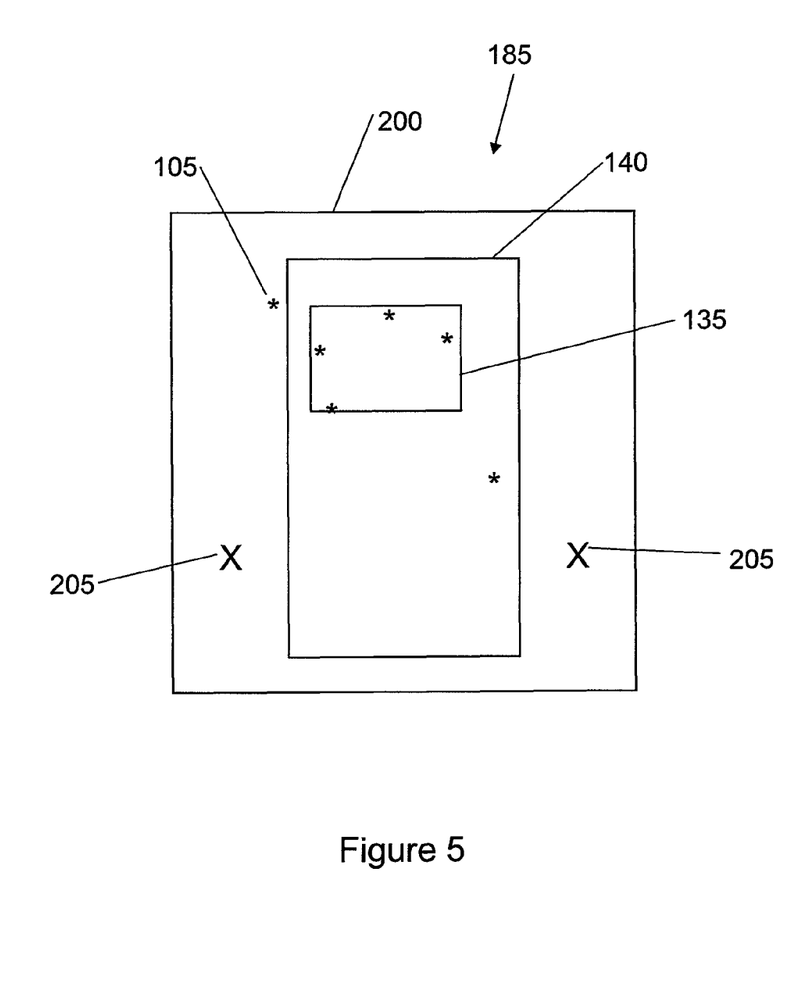
FIG. 5 shows a resulting photomask having alignment marks according to an aspect of the invention.

FIG. 5 shows a resulting photomask 185 formed using alignment marks 205 in accordance with the present invention. More specifically, the photomask blank 200 contains defects 105. As, described above, these defects 105 may be detected using the photomask blank inspection tool. Additionally, in accordance with an aspect of the invention, during the photomask inspection process using the photomask blank inspection tool, the photomask blank inspection tool is additionally used to scribe alignment marks 205 on the photomask blank. In embodiments, these alignment marks 205 may be formed in a non-critical region of the photomask blank. While the exemplary embodiment shown in FIG. 5 includes two alignment marks 205, it should be understood that the invention contemplates that any number of alignment marks 205 may be formed using the photomask blank inspection tool.

Thus, when the photomask pattern 140 is formed on the photomask blank 200, a photomask pattern generator may utilize the alignment marks 205 to more precisely position the photomask pattern 140 on the photomask blank 200. While the photomask blank 200 includes two alignment marks 205 in the exemplary embodiment of FIG. 5, it should be understood that the photomask pattern generator may utilize less than the total number of alignment marks 205 present on photomask blank in determining a proper positioning of the photomask pattern 140.

Figure 6:
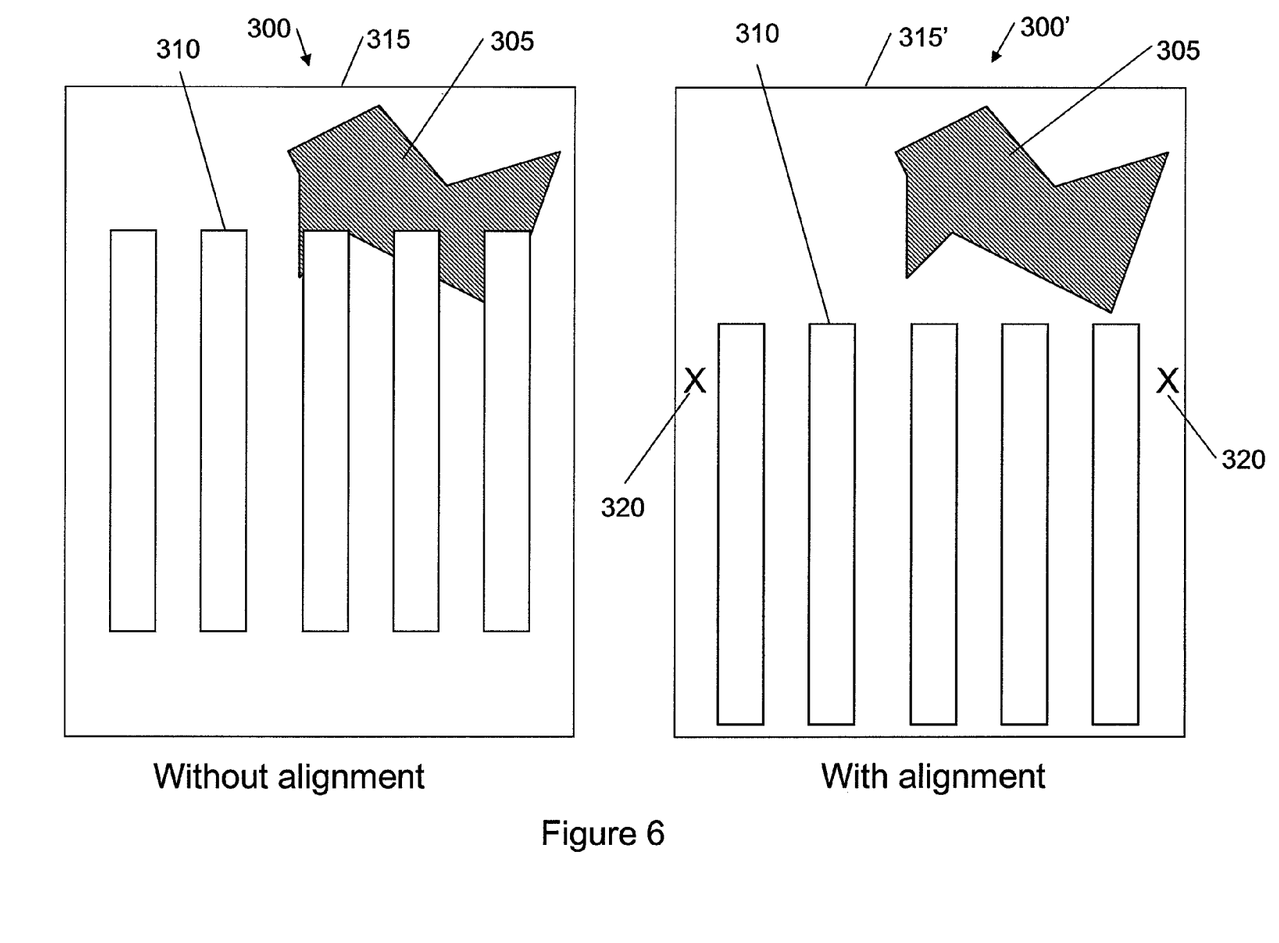
FIG. 6 shows a comparison of a resulting photomask formed without using alignment marks with a resulting photomask formed using alignment marks in accordance the invention.

FIG. 6 shows an exemplary comparison of a photomask pattern 310 formed on a photomask substrate 315 without any alignment marks with the photomask pattern 310 formed on a photomask blank 315' which has alignment marks 320 in accordance with the present invention. As shown in FIG. 6, with the resulting photomask 300 the photomask pattern 310 has been formed on the photomask blank 315 in regions containing a defect 305.

Additionally, as shown in FIG. 6, photomask blank 315' includes marking 320 formed on the photomask blank 315' using the photomask blank inspection tool. In accordance with the present invention, the photomask pattern generator may be aligned with the alignment marks 320 when the photomask pattern 310 is formed on the photomask blank 315' to more precisely position the photomask pattern 310. Thus, as shown in FIG. 6, in contrast to resulting photomask 300, with the resulting photomask 300', the photomask pattern generator has been aligned with the alignment marks 320 to more precisely position the photomask pattern 310 on the photomask blank 315'. Thus, in the exemplary embodiment of FIG. 6, the photomask pattern 310 is formed on the photomask blank 315' in regions of the photomask blank 315' that are free of defects.

FLOW DIAGRAM

Figure 7:
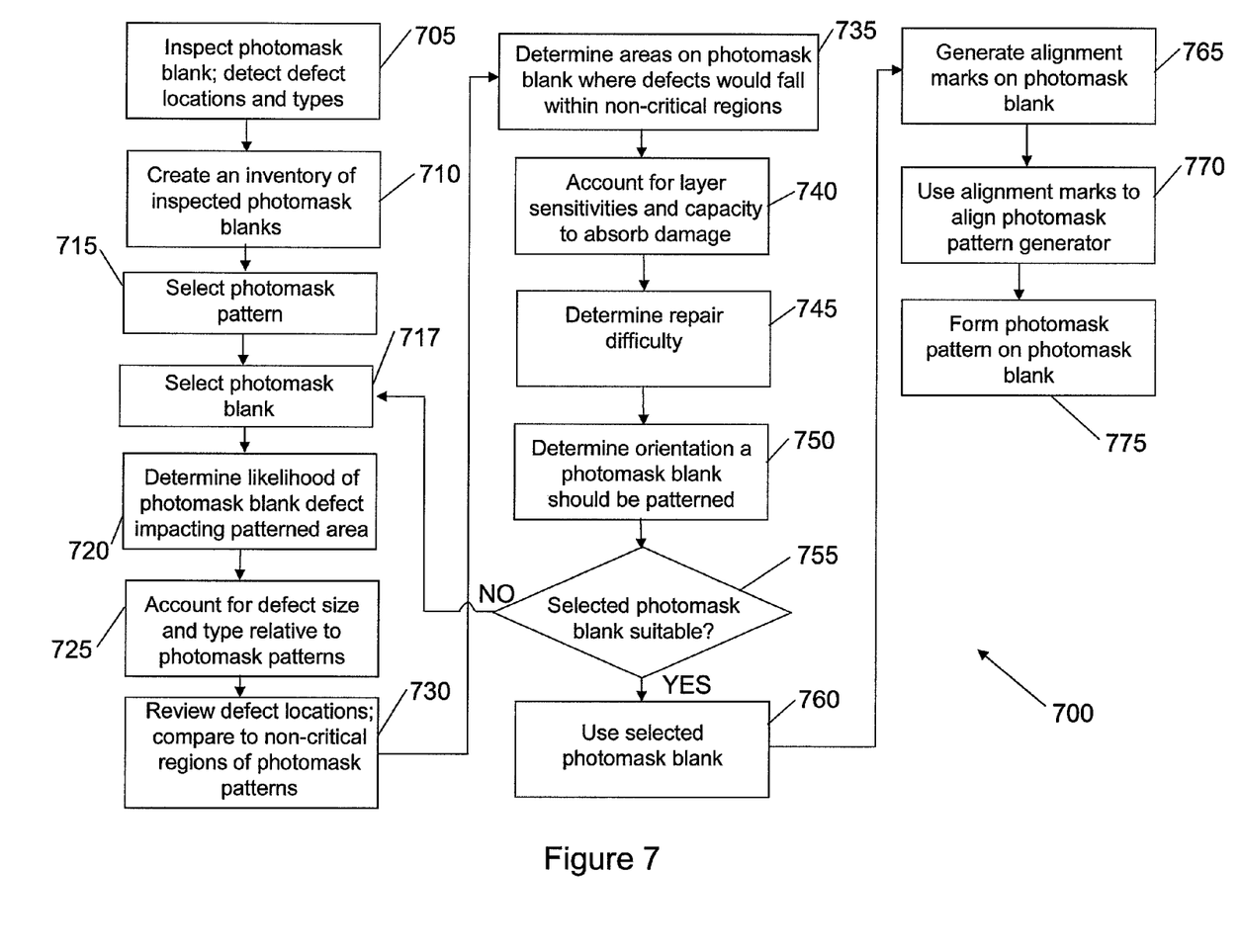
FIG. 7 shows a flow diagram implementing processes in accordance with aspects of the invention.

FIG. 7 shows an exemplary flow 700 in accordance with the present invention. FIG. 7 equally represents a high-level block diagram of the invention. At step 705, a photomask blank is inspected to detect defects using a photomask blank inspection tool. Photomask blank defect inspection information is compiled, including the detected defect locations and defect types. At step 710, an inventory of inspected photomask blanks is created and the photomask blank inspection information is fed forward for analysis. At step 715, a photomask pattern is selected, e.g., as requested from a customer. At step 717, a photomask blank is selected for analysis. At step 720, a likelihood of a photomask blank defect impacting the photomask pattern is determined, e.g., an area within a certain radius. At step 725, defect size and type are accounted for relative to the photomask pattern. At step 730, the defect locations are compared to non-critical regions, e.g., DNIRs, of the photomask pattern. At step 735, areas on a photomask blank where defects would fall within non-critical regions of the photomask pattern are determined. At step 740, layer sensitivities are accounted for, including the capacity of the layer to absorb damage (e.g., turn-around time (TAT) commitments, etc.). At step 745, the repair difficulty of a resulting photomask is determined. At step 750, orientations (e.g., 3, 6, 9 or 12 o'clock) of the photomask blank for patterning are determined. At step 755, a determination as to the suitability of the photomask blank for the photomask pattern is determined based on the determinations made at one or more of steps 720-750.

If, at step 755, the photomask blank is determined to be unsuitable for the photomask pattern due to the defects, the process continues at step 717, where another photomask blank is selected for analysis for the photomask pattern. If, at step 755, the photomask blank is determined to be suitable for the photomask pattern, at step 760, the selected photomask blank is used. At step 765, alignment marks are generated on the photomask blank using the photomask inspection tool to enable higher resolution coordinate matching. At step 770, the alignment marks are used to align the photomask pattern generator. At step 775, the selected photomask pattern is formed on the photomask blank using the photomask generator.

It should be understood, that while the steps have been described as occurring in a particular order, the invention contemplates that the steps may be performed in other orders. For example, step 770 may occur prior to step 710. Additionally, for example, step 750 may occur prior to step 740. Also, steps 725, 730 and 735 may be performed in a different order than shown in FIG. 7. Furthermore, the invention contemplates that, in embodiments, steps may be implied or omitted while still remaining true to this invention.

While the invention has been described in terms of embodiments, those of skill in the art will recognize that the invention can be practiced with modifications and in the spirit and scope of the appended claims.

What is claimed is:
1. A method comprising:
   determining defect types and defect locations on a mask blank;
   storing the defect types and the defect locations;

generating at least one alignment mark on the mask blank;
selecting a mask pattern for the mask blank based on the defect types and the defect locations;
determining a positioning of the mask pattern on the mask blank;
aligning a mask pattern generator with the mask blank in accordance with the positioning using the at least one alignment mark; and
forming the mask pattern on the mask blank using the mask pattern generator,
wherein the selecting of the mask pattern and the determining of the positioning of the mask pattern on the mask blank further comprises establishing a likelihood of a mask blank defect impacting a patterned area within a predetermined radius of each defect.

2. The method of claim 1, wherein the selecting of the mask pattern and the determining of the positioning of the mask pattern on the mask blank further comprises:
   reviewing the defect types and the defect locations; and
   comparing the defect locations to non-critical regions of the mask pattern; and
   determining regions of the mask blank where the defect locations coincide with the non-critical regions.

3. The method of claim 1, wherein the selecting of the mask pattern and the determining of the positioning of the mask pattern on the mask blank further comprises accounting for the defect types and the defect locations relative to the mask pattern.

4. The method of claim 1, wherein the selecting of the mask pattern and the determining of the positioning of the mask pattern on the mask blank further comprises accounting for at least one of:
   a layer sensitivity;
   a defect reparability; and
   a capacity to absorb damage.

5. The method of claim 1, wherein the selecting of the mask pattern and the determining of the positioning of the mask pattern on the mask blank further comprises determining an orientation of the photomask blank for patterning.

6. The method of claim 1, wherein the determining the defect types and the defect locations is performed using a mask blank inspection tool.

7. The method of claim 1, wherein the generating the at least one alignment mark on the mask blank is performed using a mask blank inspection tool.

8. A non-transitory computer program product comprising a non-transitory computer usable medium having computer readable program code embodied in the non-transitory medium to:
   determine defect types and defect locations on a mask blank using a mask blank inspection tool;
   store the defect types and the defect locations;
   generate at least one alignment mark on the mask blank using the mask blank inspection tool;
   select a mask pattern for the mask blank based on the defect types and the defect locations;
   determine a positioning of the mask pattern on the mask blank;
   align a mask pattern generator with the mask blank in accordance with the positioning using the at least one alignment mark; and
   form the mask pattern on the mask blank using the mask pattern generator,
   wherein the selection of the mask pattern and the determination of the positioning of the mask pattern on the mask blank further comprises establishing a likelihood of a mask blank defect impacting a patterned area within a predetermined radius of each defect.

9. A method comprising:
   determining defect types and defect locations on a mask blank using a mask blank inspection tool;
   storing the defect types and the defect locations in a database to create an inventory of a plurality of inspected mask blanks;
   selecting a first photomask pattern;
   selecting a first photomask blank from the inventory of the plurality of inspected mask blanks;
   determining a likelihood of a defect on the first photomask blank impacting a pattern area of the first photomask pattern, wherein the determination accounts for:
      a predetermined radius around the defect,
      a size and type of the defect relative to the first photomask pattern,
      the defect location on the first photomask blank relative to known non-critical regions of the first photomask pattern,
      layer sensitivities including a capacity of a layer to absorb damage, and
      defect reparability;
   determining whether a varied orientation of the first photomask will limit the likelihood of the defect on the first photomask blank impacting the pattern area of the first photomask pattern;
   determining a suitability of the first photomask blank for the first photomask pattern based on the determination of the likelihood of the defect on the first photomask blank impacting the pattern area of the first photomask pattern within a predetermined radius around the defect, after taking into consideration the varied orientation; and
   forming the first photomask pattern on the first photomask blank using the photomask pattern generator,
   wherein if the first photomask blank is determined to be suitable for the first photomask pattern then at least one alignment mark is generated on the first photomask blank, and the at least one alignment mark is used by the mask blank inspection tool to enable higher resolution coordinate matching of a photomask pattern generator with the first photomask blank,
   wherein if the first photomask blank is determined to be unsuitable for the first photomask pattern then a second photomask blank is selected from the inventory of the plurality of inspected mask blanks and a likelihood of a defect on the second photomask blank impacting the pattern area of the first photomask pattern within a predetermined radius around the defect, after taking into consideration the varied orientation.

\* \* \* \* \*